United States Patent [19]

Greve et al.

[11] 4,027,281
[45] May 31, 1977

[54] DIGITAL RECORDING OF SONIC LOG WAVETRAINS

[75] Inventors: Gordon M. Greve, New Orleans, La.; Charles F. Hadley; Randol R. Read, both of Tulsa, Okla.; John W. Supernaw, Broken Arrow, Okla.

[73] Assignee: Standard Oil Company, Tulsa, Okla.

[22] Filed: Oct. 3, 1975

[21] Appl. No.: 619,424

[52] U.S. Cl. .................. 340/15.5 GC; 330/29; 330/86; 340/15.5 A
[51] Int. Cl.$^2$ ............... H03G 3/30; G01V 1/40
[58] Field of Search ........... 340/15.5 TI, 15.5 A, 340/15.5 DP, 15.5 BH, 15.5 GC; 346/33 WL; 330/86, 29, 144

[56] References Cited
UNITED STATES PATENTS

| | | | |
|---|---|---|---|
| 3,322,229 | 5/1967 | Smith | 340/15.5 GC |
| 3,525,948 | 8/1970 | Sherer et al. | 340/15.5 GC |
| 3,813,609 | 5/1974 | Wilkes et al. | 340/15.5 GC |
| 3,944,942 | 3/1976 | Chudleigh, Jr. | 330/86 |

*Primary Examiner*—Howard A. Birmiel
*Attorney, Agent, or Firm*—Newell Pottorf

[57] ABSTRACT

The analog signals provided by a seismic-velocity well logger, resulting from the transmission of seismic impulses from a transmitter to a receiver in a logging sonde in a well by paths that include travel through the rock walls of the borehole, are digitally recorded. These seismic impulses and the resulting received seismic signals, or traces, are repeated approximately 20 times per second. The recording apparatus digitizes these analog traces by determining signal amplitudes at intervals of approximately 10 microseconds and temporarily stores the digital values. The apparatus includes a programmable-gain amplifier, an analog-to-digital converter, a computer, and a memory in which are, in addition to the data, also stored the values of gain which are to be used in digitizing the next signal. That is, on each digitizing interval a stored gain "program" is read out of the computer and sets the gain of the amplifier. Besides transferring the stored data to a standard computer input tape, a digital-to-analog converter and a scope are provided for displaying the successive values of gain and digitized signal, for monitoring the operation of the apparatus.

3 Claims, 5 Drawing Figures

FIG. 1

DIGITAL RECORDING OF SONIC LOG WAVETRAINS

FIELD AND BACKGROUND OF THE INVENTION

This invention relates to seismic instrumentation. More particularly, it is directed to digitizing the analog seismic signals received from a velocity well logger.

In the prior art, velocity-logging instruments have been widely used in the petroleum industry primarily by being lowered into deep boreholes to obtain information regarding the elastic-wave properties of the surrounding rocks. In the early instruments, the logging sonde was a long tubular casing having at its top end a transmitter which, at preselected intervals, initiated a seismic pulse which traveled through the water in the borehole and the walls of the borehole to a receiver at the bottom end of the sonde. Instrumentation inside the sonde measured the time interval from the initiation of the seismic impulse at the transmitter to the first arrival at the receiver, and from this traveltime was inferred the seismic wave velocity in the rocks bordering the borehole.

As this equipment became more advanced technically, it became important to determine more than just the traveltime of the first seismic arrival. Instruments were designed which could record the complete train of analog seismic signals which were received at the detector. From this added information, it became evident that there were a number of different elastic waves reaching the detector, which had traveled by various paths from the transmitter, and which might provide a considerable amount of useful information regarding the geology of the rocks surrounding the borehole, if they could be properly interpreted.

In the meantime, and in the course of conventional seismic exploration operations, great strides were made in the field of seismic wave propagation studies by digitally recording the seismic signals and using computer programs to process the digitized data. In many ways, additional important geological information was revealed.

SUMMARY OF THE INVENTION

It is a primary object of this invention to provide a field system that, by connection to the logging cable of a seismic-velocity well logger, can receive the analog signals directly from the logging sonde, digitize these signals, and record them in a form that can be used directly in a computer. It is a further object to enable the use of computer programs of the type used for processing seismic exploration data for processing these logging signals to derive from them more useful information.

These and other objects are realized and the limitations of the prior art are overcome in this invention by providing a computer-controlled digitizing apparatus, into which are delivered the analog seismic signals from the velocity logger, and out of which are provided the digitized seismic signals on magnetic tape which can be directly utilized in the computer.

The apparatus includes three storage memories used in rotation for temporarily storing (1) the gain values to be used at each digitizing interval in recording the next succeeding seismic trace, (2) the output in the form of digitized samples of the trace currently being digitized, and (3) the digitized samples of the prior seismic trace that were put into memory and are currently being transferred to magnetic tape. The apparatus includes a programmed-gain amplifier which is preset by the gain values stored in the computer memory to the value which is expected to be the optimum gain setting at each digitizing interval. The amplifier output goes to a sample-and-hold and thence to an analog-to-digital converter, the output of which, in the form of a 12-bit digital word, represents the sign and amplitude of the sample after amplification. These 12 bits representing amplitude, plus 4 bits representing the gain setting of the amplifier, form the 16-bit data word completely characterizing each digital sample which goes into the computer memory.

Each of the three memory units contains up to 4,000 computer addresses, each related to one corresponding digital sample of a seismic trace. As the successive samples of a single seismic trace are being taken, converted to digital values, and put in temporary storage, the corresponding gain values determined from a previous trace are read out in advance and used as the "program" to preset the amplifier. This determination involves scaling the amplitude of each recorded sample to determine whether on a subsequent trace, at the corresponding digitizing time interval, the gain of the amplifier should remain the same or be changed to a different value. The optimum value of gain so determined is stored in one of the three computer memories in the form of a 4-bit digital word.

Two output devices are attached to the computer through direct memory access units. One of these takes the data of the stored seismic trace, read out as values of digital amplitude and gain at each of the digitizing intervals, and transcribes these onto magnetic tape in a computer format, so that the resulting tape can be directly processed. By the other device, the data from the stored seismic trace are converted to digital values and visibly displayed so that both amplitude and gain values can be monitored.

BRIEF DESCRIPTION OF THE DRAWINGS

These and other objects and advantages of this invention will be evident and a better understanding of its principles and details of operation may be had from the following description taken in conjunction with the appended drawings, in which.

DESCRIPTION OF THE PREFERRED EMBODIMENT

Figure 1:
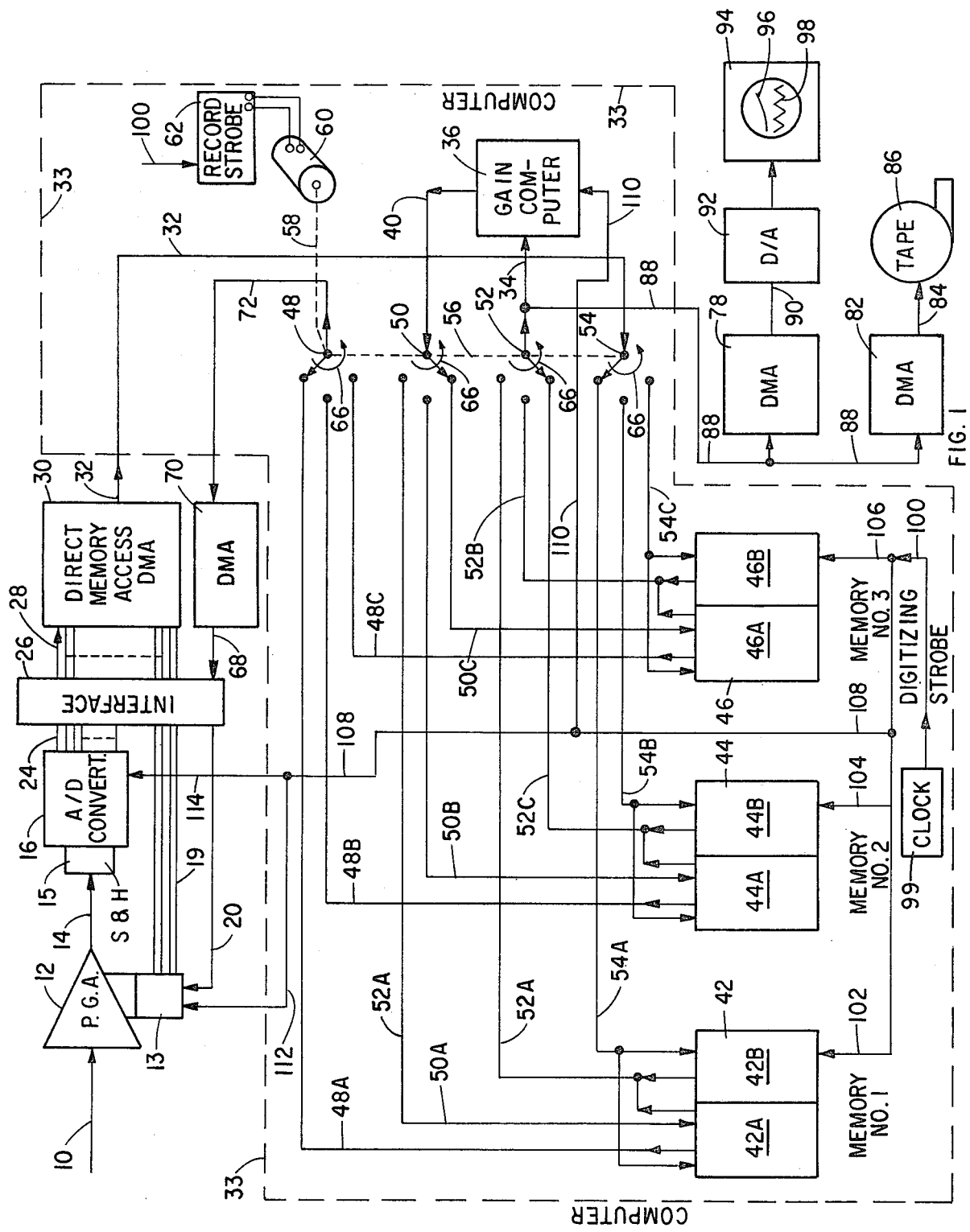
FIG. 1 represents in schematic diagram fashion one embodiment of the apparatus of this invention.

Referring now to the drawings and in particular to FIG. 1, there is shown in schematic form one possible embodiment of the apparatus of this invention.

Not shown, is the velocity logger which is supported by a cable in a deep borehole, the cable including at least one insulated conductor, line 10, by means of which the electrical signals, generated in the detector by the arrival of the seismic waves from the transmitter, travel up to the ground surface and into the digitizing apparatus. The velocity-logger transmitter repeats the seismic impulse at short intervals, generally about 50 milliseconds in length. Each of these impulses generates at the detector a seismic signal which has many component parts and may last for a time of 20 to 40 milliseconds. Each of these signals will be called a "seismic trace" by analogy to the traces observed in conventional seismic geophysical surveying, through the time scales and frequencies are of course widely different. Each of these seismic traces is to be digitized at very frequent intervals, such as every 10 microseconds, which means that at each 10-microsecond interval, a digital determination is to be made of the amplitude and sign of the seismic trace, converted to digital values and put into computer memory.

While the apparatus of this invention is normally used in conjunction with a minicomputer which is connected and programmed to control each of the several component parts and functions of the apparatus, the drawing of FIG. 1 represents it as a mechanical-electrical switching system, so as to more clearly illustrate the principles of the invention.

Line 10, by which the electrical counterpart signals representing each of the successive seismic traces are received at the digitizing apparatus, is connected to the input of a programmable-gain amplifier 12, which includes a gain register or memory 13, into which digital gain values, each comprising a 4-bit word, are inserted in sequence by means of line 20. Upon command, each gain value is transferred into amplifier 12 to preset the gain of the amplifier prior to the taking of the analog sample to be digitized. The arriving seismic trace is then amplified in accordance with the preset gain, and the output of the amplifier 12 goes over line 14 to a sample-and-hold unit 15 which is part of an analog-to-digital converter 16. As soon as the sample has been taken by the sample-and-hold 15 and while the digitizing by converter 16 proceeds, the next value of gain is transferred from gain register 13 into amplifier 12. This is done promptly because, each time a different gain is preset into the amplifier, the amplifier is disturbed and there are transient effects. Although these transients die out quickly, it is important that the gain change be made promptly after the sample is taken, so that by the time the next sample is to be taken, the amplifier will have reached equilibrium conditions.

The analog-to-digital converter 16 provides a 12-bit word representing the amplified amplitude of that particular sample of the seismic trace. The 12 bits from the analog-to-digital converter on lines 24, and the corresponding gain word of 4 bits on lines 19, both go through the interface 26 and in the form of 16 leads 28 represent a data word of 16 bits which goes through the direct memory access (DMA) unit 30 and, via a lead 32, to a selector switch 54 in a computer indicated by the dashed outline 33.

Computer 33 has three temporary memories 42, 44 and 46 (at times for brevity simply designated Nos. 1, 2, and 3, respectively), here shown as separate blocks to simplify the description of the invention, though they may actually be reserved sections of a larger single memory bank. These memories may be considered as composed of two parts, a 4-bit gain word part 42A, and a 12-bit amplitude word part 42B. Similarly, memory 44 comprises the two parts 44A and 44B, and the same for parts 46A and 46B of memory 46. The output of the DMA 30 in the form of a 16-bit digital word goes via lead 32, switch 54, and lead 54A to both parts 42A and 42B of memory No. 1 where it is stored at a specific address which is one of 4,000 addresses, each corresponding to a particular one of the up to 4,0000 samples of each seismic trace. At the same time that the digital data from DMA 30 are going into memory No. 1, the digital value of gain computed from a prior trace and previously stored in memory part 42A is being read out via lead 48A, switch 48, lead 72, direct memory access unit 70, lead 68, interface 26 and lead 20, into the gain register or buffer 13 of amplifier 12.

It will be explained in more detail later how the gain can be read out and the digitized data can be stored at the same time in the same memory 42. Briefly, the values of gain are read out before the data are introduced, and therefore there are empty addresses into which the data values can be stored as they come in via lead 54A from switch 54. Turning now to memory No. 2, which so far has not been discussed, the prior trace data stored in it are read out of the two parts 44A and 44B and proceed via lead 52C, which 52, lead 88, direct memory access 78, lead 90, and digital-to-analog converter 92 to a display or monitor oscilloscope 94. Shown on the face of scope 94 are two curves 96 and 98, respectively representing the successive values of gain used in digitizing the prior seismic trace and the successive amplified amplitudes of that trace. A second direct memory access 82 also connected to lead 88 transfers the data being read out from memory No. 2 via lead 84 to a conventional magnetic tape recording unit 86 which stores it in an appropriate format for further data processing by a computer utilizing programs of the type employed in conventional seismic exploration data processing.

It will be recalled that the 16-bit data word being read out from memory No. 2 to lead 52C, switch 52, and lead 88 contains 4 bits of gain and 12 bits of amplified amplitude. Therefore, full information is provided to the display traces 96 and 98 of gain and amplitude. Although these values relate to the previously digitized seismic trace, since successive traces are only 50 milliseconds apart in time and ordinarily do not change character greatly in this interval, they are sufficiently current for monitoring purposes.

By a lead 34 connected to lead 88, the trace data from memory 44 go also to a gain computer 36 which analyzes the amplified amplitude of each sample. If it is found to be at either the upper or the lower limit of converter 16, then a new lesser or greater value of gain to be used for the next-to-be-received seismic trace is determined and sent via lead 40, switch 50, and lead 50C to memory 46A.

To use the three memories in rotation, switches 48, 50, 52 and 54 are shown as driven in the direction of arrows 66 by step motor 60 through linkage means 56, 58 as a convenient way of illustrating the digitizing and recording operation of the computer 33. However, because of the high digitizing frequency and resulting short times available, the switching is actually done by the computer 33 using high-speed electronic switches.

Figure 2:
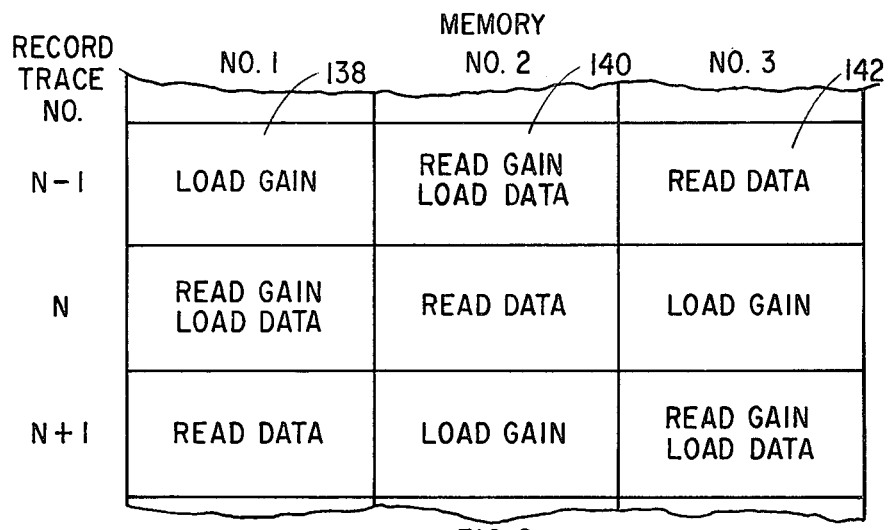
FIG. 2 is a diagram showing the utilization of the three computer memories.

Referring now to FIG. 2, there is shown a series of three columns, labeled memories Nos. 1, 2 and 3, and three rows of boxes labeled N − 1, N, and N + 1, representing the identification numbers of the seismic traces being digitized. For each trace N, there are up to 4,000 samples to be taken, digitized, and stored temporarily in one of memories 1, 2, or 3. At the time a particular seismic trace N − 1 is being digitized, memory 1 in box 138 will be loading the gains from computer 36 to be used with the next trace N to be digitized. Simultaneously, memory No. 2 is being unloaded of the gains placed there on the previous trace N − 2, which values of gain are going to control the gain of the amplifier for trace N − 1.

Consider in particular box 140 of FIG. 2, where two operations are going on simultaneously: reading-out of gain words, and loading-in of data words. This can be done due to the availability of gain register 13 since the reading-out of gain words can start before the loading-in of data. For example, referring to FIG. 1, one gain word has just been used by amplifier 12 in taking the sample being digitized and the next has been inserted into amplifier 12 from gain register 13. Another gain word has just been withdrawn from memory and is in gain register 13 ready for insertion into amplifier 12.

Figure 4:
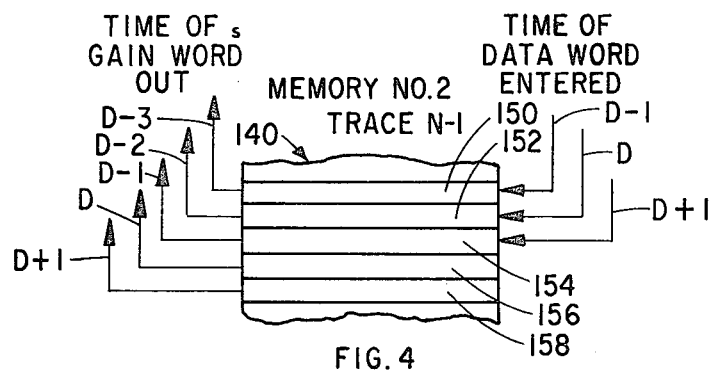
FIG. 4 represents some of the storage addresses in one of the digital memories.

Referring to FIG. 4, there is shown diagrammatically the part of memory No. 2 for trace N − 1 corresponding to box 140. In the memory are a number of separate address locations (up to 4,000), each holding the gain word for a corresponding particular digitizing interval, such as addresses 150, 152 . . . 158, etc. Withdrawal of gain words starts before the start of data word entry. For example, during digitizing interval D − 3, the gain word for interval D − 1 was read from address location 150 and entered into gain register 13. During interval D − 2, it was transferred into amplifier 12, while the D gain word was being transferred from location 152 to register 13. During interval D − 1, gain D − 1 is in control of amplifier 12 at the instant of taking sample D − 1. This leaves memory locations 150 and 152 vacant so that the entry of data word D − 1 into location 150 occurs without complication immediately at the end of digitizing. At the same time, gain word D was transferred from register 13 into amplifier 12 and gain word D + 1 was read from location 154 into register 13. Thus, at the next sampling interval D, gain D is in control for the taking of sample D, which is stored at vacant location 152, and so on.

In box 142 labeled N − 1 of memory 3, FIG. 2, the data digitized and stored for the previous seismic trace N − 2 are being read out and are going to the tape 86 as well as to gain computer 36 for determination of the proper new gain being stored in memory No. 1, box 138. Although this means that gains calculated from trace N − 2 will control amplifier 12 during the digitizing of trace N, the time interval between traces N − 2 and N is typically only 100 ms, during which neither the logging depth nor the trace character changes very much.

When trace N is being digitized, the gains just previously recorded and stored in memory No. 1 are read out two digits in advance in present amplifier 12, and the current data being determined for trace N are loaded into the just vacated address of memory 1. The data just previously recorded in memory 2 for trace N − 1 are being read out to tape 86, and in memory 3 the gains being determined by computer 36 from the just prior digitized trace N − 1 are being loaded and will be used to control the gain during digitizing of trace N + 1, and so on. It may be noted that the positions of switches 48, 50, 52, and 54 in FIG. 1 correspond to the digitizing of trace N in FIG. 2. Noteworthy also is the face that the four simultaneous functions of loading and reading gains and loading and reading data would normally require four separate memories. Here, however, due to the use of buffer register 13 to hold each gain value one digitizing interval, plus an additional delay in amplifier 12 while it stabilizes, with the result that memory storage addresses become vacant just before they are needed to hold data, only three memories are required.

Gain computer 36, which serves the purpose of preparing gain values for each of the digitizing intervals of the second successive trace, can determine the gain program in various ways. One of these is to maintain a constant gain, which is one way velocity loggers are normally operated. Another way is to determine a gain expansion curve which increases the gain with time due to the fact that attenuation of the seismic waves is a function of distance and of travel time. An average or overall curve of gain v. time (generally an exponential curve) can be computed by computer 36 and set into the appropriate computer memory in accordance with FIG. 2.

The optimum and preferred manner of determining gain, however, is to examine by computer 36 the value of the amplified amplitude of the seismic trace at each digitizing interval. If this amplitude is at the upper limit of A-D converter 16, that means that the amplified sample amplitude was probably higher than could be recorded by the 12 bits. It is obvious, therefore, that the gain for that sample on the subsequent trace should be reduced so as to avoid distortion in the recording and digitizing. On the other hand, if the amplified instantaneous amplitude is at the lower limit of converter 16, it means that the amplitude is low and the gain can be increased for that particular sample without overloading the amplifier and distorting the signal. So, a simple apparatus for determining whether the gain should be increased, decreased, or remain the same on the corresponding sample of the subsequent trace can be based on an examination by computer 36 of where the digitized amplified trace amplitude is with respect to the limits of converter 16.

Step motor 60 is shown in FIG. 1 as controlled by a record strobe 62 to shift switches 48, 50, 52, 54 one contact position between each successive recording of a 4,000-word trace. To allow maximum time for the decay of any switching transients, this switching is preferably done at the end of each 4,000-word trace digitizing cycle; that is, record strobe 62 is inhibited or counts down during 4,000 counts of digitizing strobe 100 and then transmits its strobe pulse to step motor 60 after the 4,000 digitizing pulse. Since digitizing the traces uses only 40 milliseconds of the 50 or so milliseconds between down-hole pulse transmissions, the resulting gap of about 10 milliseconds is thus available for switching and other functions.

The programmed-gain amplifier 12 is a conventional constant-gain amplifier, generally of multiple stages, each of which has been modified by feedback resistances which can be inserted or withdrawn by means of electronic switches. Thus, the effective gain of amplifier 12 is set in accordance with which of the switches are open or closed as controlled by the digital signals drawn from memory and sent to gain buffer 13 over lead 20.

The digitizing of the seismic traces is done very rapidly upon command of a clock 99 which provides a signal pulse to lead 100 at each 10 microseconds. This is the digitizing strobe which via leads 102, 104, 106 controls the read-in and read-out of data and gain into and out of the three memories, via leads 108, 112 controls the shifting of gain into buffer 13, and then into amplifier 12, controls over lead 114 the taking of the sample by sample-and-hold 15 and controls by lead 110 the outputting of a new value of gain from computer 36. Thus, all of the parts of the system are synchronized by means of digitizing strobe signal 100.

Figure 3:
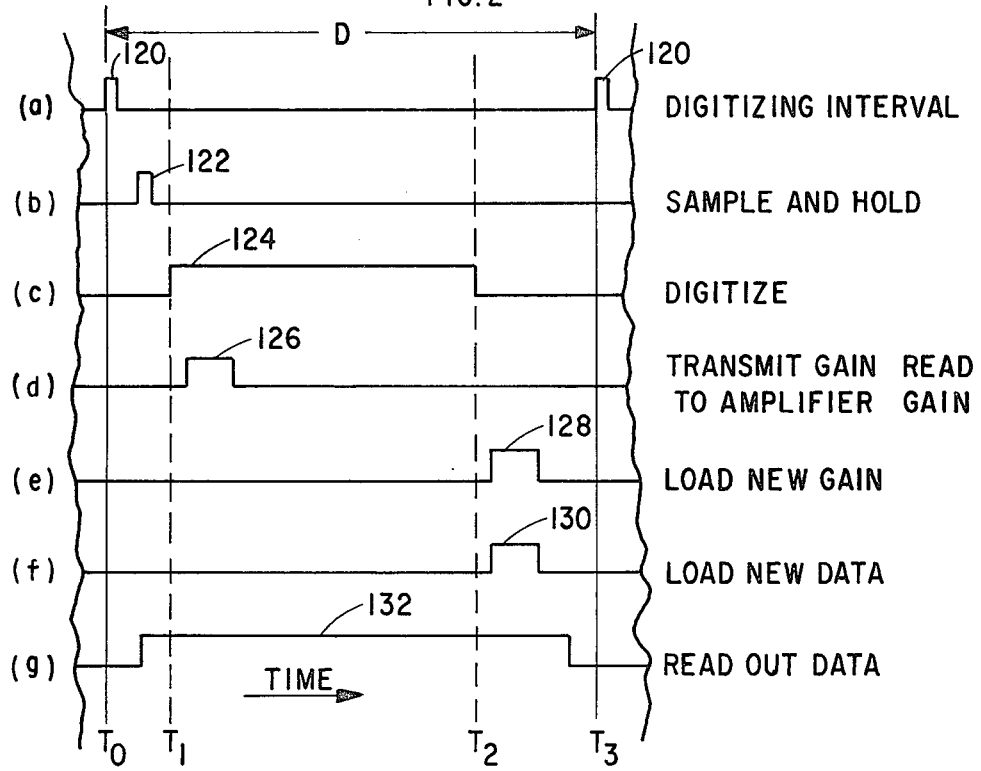
FIG. 3 graphically represents, in time scale, the various signals transmitted and the various operations carried out in the apparatus of FIG. 1.

The time relation of some of these functions is graphically shown in FIG. 3 by the traces labeled (a), (b) . . . (g). Each of these represents a particular signal generated by the computer 33. The horizontal dimension from $T_0$ to $T_3$ is time, the dimension D representing the 10-microsecond time interval of one digitizing interval. That is, each 10 microseconds the clock 99 generates a pulse 120, trace (a), which initiates the operation. Immediately after the pulse 120, a second pulse 122, trace (b), occurs which controls sample-and-hold 15 and says "Take your sample". Thereafter, in accordance with trace (c) and the longer pulse 124 extending between times $T_1$ and $T_2$, the sample is digitized in analog-to-digital converter 16. Trace (d) represents the signal pulse 126 that transmits the new gain from buffer 13 into amplifier 12. This is done as soon as the sample is taken by sample-and-hold 15 and digitizing is started, to allow most of the digitizing interval for the switching transients in amplifier 12 to decay. Also, pulse 126 can effect the readout of gain for the next digit from memory into buffer 13. Trace (e) represents the signal to load the new gain which has been determined by computer 36 and which is then put into memory for use in digitizing the next seismic trace. Trace (f) and pulse 130 represent the signal to load the new data from converter 16 into memory by interface 26 and DMA 30. Trace (g) represents the signal 132 and the time taken or available to read out from memory to tape 86 the stored data of the previous seismic trace. Since the readout of data is simply an arrangement between the computer, the memory, and the tape 86, this can occur on an irregular basis and may be done over an extended period within the 50-millisecond time span of one seismic pulse transmission whenever the computer is available to provide the necessary read and transfer commands.

Figure 5:
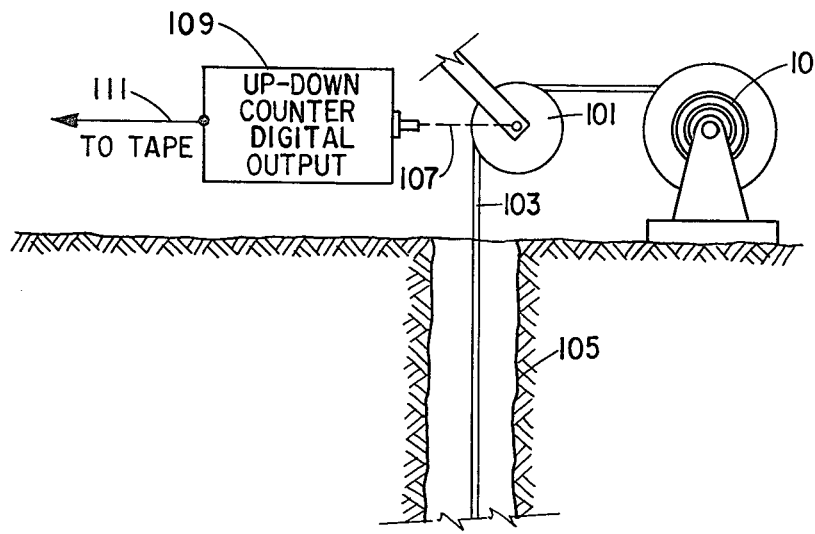
FIG. 5 shows the generation of depth data to be recorded in correlation with the seismic trace data.

As previously mentioned, most conventional logging systems operate on a pulse and trace repetition rate of approximately 20 per second with the sonde moving, so that each successive trace is recorded at a slightly different elevation or depth in a well. It is important to know the precise depth of the sonde at the time any given trace was digitized and recorded. As shown in FIG. 5, it is customary in a logging system to provide a wheel 101 set above the top of the well casing over which runs the cable 103 that supports the sonde in the borehole 105. The circumference of wheel 101 is made precisely a selected length so that each revolution of the wheel corresponds to a certain change in depth of the sonde.

By mechanical connection 107 to an up-down counter 109, a count is kept of the exact depth of the sonde in the well 105, counter 109 transmitting the depth as a running digital output on lead 111 for recording on tape 86 in correlation with the digitized wave-train data. For example, counter 109 may contain a register like gain register 13 which always holds the current depth reading, which is transferred upon command by computer 33 to tape 86 in the 10-millisecond time interval between the end of digitizing each trace and the start of the next.

While the invention has been described with a certain degree of particularity, it is manifest that many changes may be made in the details of construction and in the arrangement of components. Specifically, the pulse transmission rate of 20 per second, and the digitizing of 40 milliseconds of the received-wave trace at 10 microsecond intervals, while typical of current commercial logging operations, may be varied considerably depending on the character and use of the down-hole data. It is understood that the invention is not to be limited to the specific language used or the specific embodiments set forth herein, by way of exemplifying the invention, but the invention is to be limited only by the scope of the attached claims, including the full range of equivalents to which each element or step thereof is entitled.

We claim:

1. In a velocity logging system including a sonde and cable means for traversing said sonde through a borehole, said sonde including transmitter means for sequentially generating seismic waves in the fluid in said borehole, receiver means for detecting said seismic waves after travel by various paths through the surrounding fluid and earth media, and means to generate electrical signal counterparts of said detected seismic waves and to transmit said counterpart signals to the ground surface, the improvement comprising digitizing apparatus for said counterpart signals comprising
   a. programmable-gain amplifier means for receiving and amplifying said counterpart signals in accordance with a digital gain control signal applied to said amplifier;
   b. means to digitize a selected time sample of said amplified signal;
   c. means comprising at least three digital storage areas to temporarily store a digital data word including said digitized sample and a digitized value of gain of said amplifier used in digitizing said sample;
   d. means to determine from said data word a new digital gain value for said amplifier to be used on the corresponding sample of a subsequent trace and means to temporarily store said new digital value or gain;
   e. means to read out of storage a digital value of gain and transmit that value to said amplifier;
   f. means to read out of storage said data and to reproducibly record said data on magnetic tape;
   g. clock means for generating a series of control impulses to time the repeated operation of said means (b) through (f) to produce a corresponding series of data words representing a sesimic trace; and
   h. switching means to use said areas in rotation for (1) the reading out of digital gain values and storing of data words, (2) the storing of digital gain values, and (3) the reading out of data words.

2. Digitizing apparatus as in claim 1 including means to energize said switching means at the conclusion of digitizing each seismic trace.

3. Digitizing apparatus as in claim 1 in which said means (e) to read out and transmit a digital gain value includes a buffer storage for holding said value at least one digitizing interval before it sets the gain of said amplifier, whereby each gain word storage location within said storage area is vacated at least one digitizing interval before a data word is entered in said location.

* * * * *